(12) United States Patent
Su et al.

(10) Patent No.: US 10,593,415 B2
(45) Date of Patent: Mar. 17, 2020

(54) SHIFT REGISTER UNIT AND DRIVING METHOD THEREOF, GATE DRIVING CIRCUIT

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Haifei Su, Beijing (CN); Shuai Xu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 44 days.

(21) Appl. No.: 15/780,157

(22) PCT Filed: Nov. 10, 2017

(86) PCT No.: PCT/CN2017/110366
§ 371 (c)(1),
(2) Date: May 30, 2018

(87) PCT Pub. No.: WO2018/205526
PCT Pub. Date: Nov. 15, 2018

(65) Prior Publication Data
US 2019/0355432 A1      Nov. 21, 2019

(30) Foreign Application Priority Data

May 12, 2017   (CN) .......................... 2017 1 0332248

(51) Int. Cl.
*G11C 19/28*   (2006.01)
*G09G 3/36*    (2006.01)

(52) U.S. Cl.
CPC ........... *G11C 19/28* (2013.01); *G09G 3/3674* (2013.01); *G09G 2310/0286* (2013.01)

(58) Field of Classification Search
CPC ................. G11C 19/28; G09G 3/3674; G09G 2310/0286
See application file for complete search history.

(56) References Cited

U.S. PATENT DOCUMENTS

2008/0187089 A1* 8/2008 Miyayama ............. G11C 19/28
377/79
2010/0067646 A1* 3/2010 Liu ........................ G11C 19/28
377/69

(Continued)

FOREIGN PATENT DOCUMENTS

CN        105185345 A  * 12/2015
CN        105185345 A    12/2015
(Continued)

OTHER PUBLICATIONS

PCT International Search Report, Application No. PCT/CN2017/110366, dated Feb. 23, 2018, 10 pages: with English translation.
(Continued)

*Primary Examiner* — Nitin Patel
*Assistant Examiner* — Amy Onyekaba
(74) *Attorney, Agent, or Firm* — Armstron Teasdale LLP (57) ABSTRACT

The shift register unit includes an input circuit, a first reset circuit, an output circuit, a second reset circuit, and a first pull-down control circuit. The input circuit provides a forward scan control signal to a first node according to an input signal. The first reset circuit provides a reverse scan control signal to the first node according to a reset signal. The output circuit provides a clock signal to a signal output terminal according to the voltage of the first node. The second reset circuit provides a first voltage signal to the first node and the signal output terminal according to the voltage of a second (Continued)

node. The first pull-down control circuit controls the voltage of the second node according to the voltage of the first node.

16 Claims, 8 Drawing Sheets

(56) References Cited

U.S. PATENT DOCUMENTS

| | | | | |
|---|---|---|---|---|
| 2013/0088265 | A1* | 4/2013 | Chen | H03K 5/153 327/108 |
| 2014/0168044 | A1* | 6/2014 | Hu | G09G 3/3696 345/90 |
| 2016/0093264 | A1* | 3/2016 | Gu | G11C 19/28 345/212 |
| 2016/0172054 | A1* | 6/2016 | Shao | G11C 19/184 345/100 |
| 2016/0268004 | A1* | 9/2016 | Li | G11C 19/28 |
| 2016/0300536 | A1* | 10/2016 | Li | G09G 3/344 |
| 2016/0372069 | A1* | 12/2016 | Lv | G09G 3/36 |

FOREIGN PATENT DOCUMENTS

| | | | |
|---|---|---|---|
| CN | 105405387 | A | 3/2016 |
| CN | 106898287 | A * | 6/2017 |
| CN | 106898287 | A | 6/2017 |
| CN | 106910470 | A | 6/2017 |
| CN | 106935220 | A | 7/2017 |

OTHER PUBLICATIONS

PCT Written Opinion, Application No. PCT/CN2017/110366, dated Feb. 23, 2018, 6 pages.: with English translation of relevant part.

* cited by examiner

SHIFT REGISTER UNIT AND DRIVING METHOD THEREOF, GATE DRIVING CIRCUIT

CROSS REFERENCE TO RELATED APPLICATIONS

The present patent application is a National Stage Entry of PCT/CN2017/110366 filed on Nov. 10, 2017, which claims the benefit and priority of Chinese Patent Application No. 201710332248.1 filed on May 12, 2017, the disclosures of which are incorporated herein by reference in their entirety as part of the present application.

BACKGROUND

Embodiments of the present disclosure relate to the field of display control technologies, and in particular, to a shift register unit and a driving method thereof, a gate driving circuit, a display panel, and a display device.

Liquid crystal displays (LCDs) have the advantages of low radiation, small size and low energy consumption, and are widely used in electronic products such as laptops, flat-screen televisions, cellphones, etc. A liquid crystal display comprises pixel units arranged in a matrix. When the liquid crystal display images, a data driving circuit can latch inputted display data and clock signals according to the timing, and convert them into analog signals which then are inputted into data line of the liquid crystal panel. The gate driving circuit can convert an inputted clock signal, through the shift register, into a voltage for controlling the pixel units to be turned on/off, and apply it to gate line of the liquid crystal display row by row.

In order to reduce the production cost of the liquid crystal display, the existing gate driving circuits generally employ a gate driver on array (GOA) technology, to integrate a gate switching circuit of a thin film transistor (TFT) on the array substrate of the display panel, so as to perform the scan driving of the display panel. Such a gate driving circuit integrated on the array substrate using the GOA technology is also referred to as a GOA circuit or a shift register. Costs for a display device using a GOA circuit can be reduced in terms of both material and manufacturing process, as the bonding driving circuit can be omitted.

BRIEF DESCRIPTION

An embodiment of the present disclosure provides a shift register unit and a driving method thereof, a gate driving circuit, a display panel, and a display device.

A first aspect of the present disclosure provides a shift register unit including an input circuit, a first reset circuit, an output circuit, a second reset circuit, and a first pull-down control circuit. The input circuit is configured to provide a forward scan control signal from a forward scan control signal terminal to a first node according to an input signal from a signal input terminal. The first reset circuit is configured to provide, according to a reset signal from a reset signal terminal, a reverse scan control signal from a reverse scan control signal terminal to the first node to reset the voltage of the first node. The output circuit is configured to provide a clock signal from a clock signal terminal to a signal output terminal as an output signal according to the voltage of the first node. The second reset circuit is configured to provide, according to the voltage of a second node, a first voltage signal from a first voltage signal terminal to the first node and the signal output terminal to reset the voltage of the first node and the output signal. The first pull-down control circuit is configured to control the voltage of the second node according to the voltage of the first node.

In an embodiment of the present disclosure, during forward scanning, the forward scan control signal is an AC voltage signal, and the reverse scan control signal is a DC voltage signal. During reverse scanning, the reverse scan control signal is an AC voltage signal, and the forward scan control signal is a DC voltage signal. In addition, the AC voltage signal and the clock signal have the same frequency and opposite phases.

In an embodiment of the present disclosure, the input circuit may include a first transistor having a control electrode coupled to the signal input terminal, a first electrode coupled to the forward scan control signal terminal, and a second electrode coupled to the first node.

In an embodiment of the present disclosure, the first reset circuit may include a second transistor having a control electrode coupled to the reset signal terminal, a first electrode coupled to the reverse scan control signal terminal, and a second electrode coupled to the first node.

In an embodiment of the present disclosure, the output circuit may include a third transistor and a first capacitor. The third transistor has a control electrode coupled to the first node, a first electrode coupled to the clock signal terminal, and a second electrode coupled to the signal output terminal. The first capacitor is coupled between the first node and the signal output terminal.

In an embodiment of the present disclosure, the second reset circuit may include a fourth transistor and a fifth transistor. The fourth transistor has a control electrode coupled to the second node, a first electrode coupled to the first voltage signal terminal, and a second electrode coupled to the first node. The fifth transistor has a control electrode coupled to the second node, a first electrode coupled to the first voltage signal terminal, and a second electrode coupled to the signal output terminal.

In an embodiment of the present disclosure, the first pull-down control circuit may include a sixth transistor, a seventh transistor, an eighth transistor, and a ninth transistor. The sixth transistor has a control electrode coupled to the first node, a first electrode coupled to the first voltage signal terminal, and a second electrode coupled to the second node. The seventh transistor has a first electrode coupled to the second voltage signal terminal, and a second electrode coupled to the second node. The eighth transistor has a control electrode coupled to the first node, a first electrode coupled to the first voltage signal terminal, and a second electrode coupled to the control electrode of the seventh transistor. The ninth transistor has a control electrode and a first electrode coupled to the second voltage signal terminal, and a second electrode coupled to the control electrode of the seventh transistor.

In an embodiment of the present disclosure, the shift register unit may further include a second pull-down control circuit configured to provide a first voltage signal from the first voltage signal terminal to the signal output terminal according to a third voltage signal from a third voltage signal terminal.

In an embodiment of the present disclosure, the second pull-down control circuit may include a tenth transistor. The tenth transistor has a control electrode coupled to the third voltage signal terminal, a first electrode coupled to the first voltage signal terminal, and a second electrode coupled to the signal output terminal.

A second aspect of the present disclosure provides a shift register unit including first to ninth transistors and a first capacitor. A control electrode of the first transistor is coupled to a signal input terminal, a first electrode of the first transistor is coupled to a forward scan control signal terminal, and a second electrode of the first transistor is coupled to a first node. A control electrode of the second transistor is coupled to a reset signal terminal, a first electrode of the second transistor is coupled to a reverse scan control signal terminal, and a second electrode of the second transistor is coupled to the first node. A control electrode of the third transistor is coupled to the first node, a first electrode of the third transistor is coupled to a clock signal terminal, and a second electrode of the third transistor is coupled to a signal output terminal. A first capacitor is coupled between the first node and the signal output terminal. A control electrode of the fourth transistor is coupled to a second node, a first electrode of the fourth transistor is coupled to a first voltage signal terminal, and a second electrode of the fourth transistor is coupled to the first node. A control electrode of the fifth transistor is coupled to the second node, a first electrode of the fifth transistor is coupled to the first voltage signal terminal, and a second electrode of the fifth transistor is coupled to the signal output terminal. A control electrode of the sixth transistor is coupled to the first node, a first electrode of the sixth transistor is coupled to the first voltage signal terminal, and a second electrode of the sixth transistor is coupled to the second node. A first electrode of the seventh transistor is coupled to a second voltage signal terminal, and a second electrode of the seventh transistor is coupled to the second node. A control electrode of the eighth transistor is coupled to the first node, a first electrode of the eighth transistor is coupled to the first voltage signal terminal, and a second electrode of the eighth transistor is coupled to the control electrode of the seventh transistor. A control electrode and a first electrode of the ninth transistor are coupled to the second voltage signal terminal, and a second electrode of the ninth transistor is coupled to the control electrode of the seventh transistor.

In an embodiment of the present disclosure, the shift register unit further includes a tenth transistor. A control electrode of the tenth transistor is coupled to a third voltage signal terminal, a first electrode of the tenth transistor is coupled to the first voltage signal terminal, and a second electrode of the tenth transistor is coupled to the signal output terminal.

A third aspect of the present disclosure provides a method for driving the shift register unit according to the first or second aspect of the present disclosure described above. In a first time period, an input signal is provided to the input circuit through a signal input terminal so that the input circuit is turned on, a forward scan control signal from the forward scan control signal terminal is outputted to a first node through the input circuit so that an output circuit is turned on, a clock signal from the clock signal terminal is outputted to a signal output terminal through the output circuit, and voltage of a second node is controlled by a first pull-down control circuit according to voltage of the first node. In a second time period, the output circuit maintains turned on so that the clock signal is outputted to the signal output terminal, and the voltage of the second node is controlled by the first pull-down control circuit according to the voltage of the first node. In a third time period, a reset signal is provided to the first reset circuit through a reset signal terminal so that a first reset circuit is turned on, a reverse scan control signal from a reverse scan control signal terminal is outputted to the first node through the first reset circuit to reset the voltage of the first node so that the output circuit is turned off, a second voltage signal from the second voltage signal terminal is provided to the second node so that the second reset circuit is turned on, and a first voltage signal from the first voltage signal terminal is outputted to the first node and the signal output terminal through the second reset circuit to reset the voltage of the first node and the signal output terminal. In addition, in the method, the forward scan control signal terminal outputs an AC voltage signal, the reverse scan control signal terminal outputs a DC voltage signal, and the AC voltage signal and the clock signal have the same frequency and opposite phases.

In an embodiment of the present disclosure, the forward scan control signal terminal outputs a DC voltage signal, and the reverse scan control signal terminal outputs an AC voltage signal. A reset signal is provided to the signal input terminal and an input signal is provided to the reset signal terminal.

In an embodiment of the present disclosure, before each frame starts, a third voltage signal is provided to a second pull-down control circuit through a third voltage signal terminal, so that the second pull-down control circuit is turned on so as to provide the first voltage signal from the first voltage terminal to the signal output terminal and reset the voltage of the signal output terminal.

A fourth aspect of the present disclosure provides a gate driving circuit. The gate driving circuit may include a plurality of cascaded shift register units according to the first or second aspect of the present disclosure described above. A signal output terminal of a shift register unit of the stage is coupled to a signal input terminal of the shift register unit of respective next stage, a reset signal terminal of a shift register unit of the a stage is coupled to the signal output terminal of the shift register unit of respective next stage. For a (2N−1)st-stage shift register unit, a first forward scan control signal is inputted to a forward scan control signal terminal, a first reverse scan control signal is inputted to a reverse scan control signal terminal, and a first clock signal is inputted to a clock signal terminal, wherein the first forward scan control signal and the first clock signal have the same frequency and opposite phases. For a 2Nth-stage shift register unit, a second forward scan control signal is inputted to the forward scan control signal terminal, a second reverse scan control signal is inputted to the reverse scan control signal terminal, and a second clock signal is inputted to the clock signal terminal, wherein the second forward scan control signal and the second clock signal have the same frequency and opposite phases. In addition, the first forward scan control signal and the second forward scan control signal have opposite phases, and the first clock signal and the second clock signal have opposite phases.

A fifth aspect of the present disclosure provides a display panel, including a gate driving circuit according to the fourth aspect of the present disclosure described above.

A sixth aspect of the present disclosure provides a display device, including a display panel according to the fifth aspect of the present disclosure described above.

BRIEF DESCRIPTION OF DRAWINGS

In order to illustrate the technical solution of the present disclosure more clearly, the drawings of the embodiments will be briefly described below. It should be appreciated that the drawings described below are merely some of the embodiments of the present disclosure, rather than limiting the scope of the present disclosure, in which.

DETAILED DESCRIPTION

In order to make the technical solutions and advantages of the embodiments of the present disclosure clearer, the technical solutions of the embodiments of the present disclosure will be clearly and completely described below with reference to the accompanying drawings. The described embodiments are only a part rather than all of the embodiments of the present disclosure. All other embodiments obtained by those of ordinary skill in the art based on the described embodiments without creative efforts shall also fall within the scope of the present disclosure.

As below, unless otherwise specified, the expression "element A coupled to element B" means that element A is "directly" connected to element B or "indirectly" connected to element B through one or more other elements.

Figure 1:
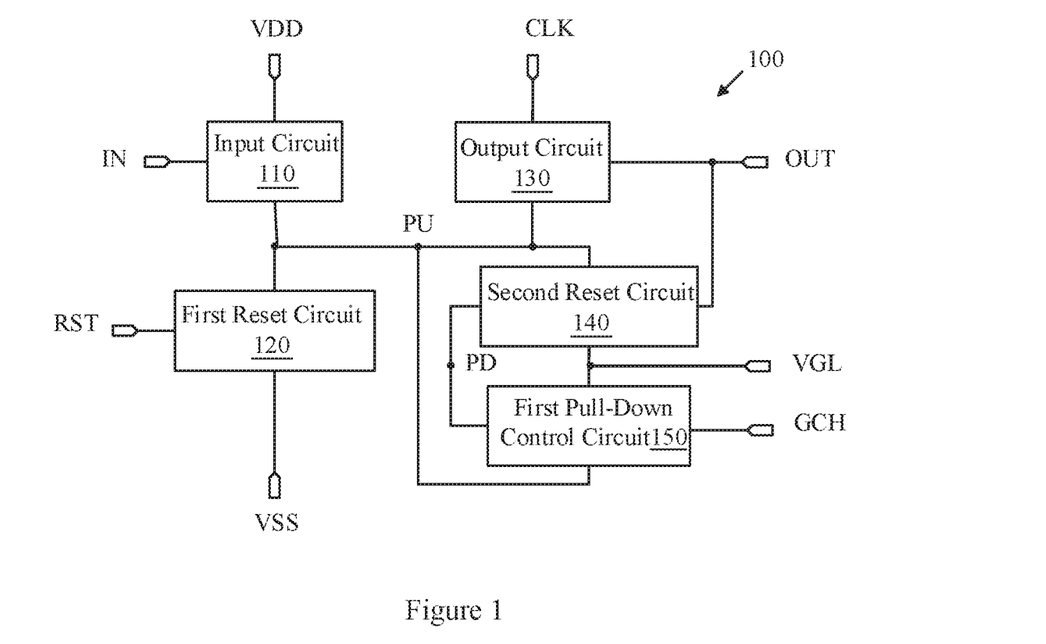
FIG. 1 is a schematic block diagram of a shift register unit according to an embodiment of the present disclosure.

FIG. 1 shows a schematic block diagram of a shift register unit 100 according to an embodiment of the present disclosure. As shown in FIG. 1, the shift register unit 100 may include an input circuit 110, a first reset circuit 120, an output circuit 130, a second reset circuit 140, and a first pull-down control circuit 150.

The input circuit 110 may be coupled to a forward scan control signal terminal VDD, a signal input terminal IN, and a first node PU. The input circuit 110 can provide a forward scan control signal VDD from the forward scan control signal terminal VDD to the first node PU (also referred as a "pull-up node"), under the control of an input signal Input from the signal input terminal IN.

The first reset circuit 120 may be coupled to the first node PU, a reverse scan control signal terminal VSS, and a reset signal terminal RST. The first reset circuit 120 may provide a reverse scan control signal VSS from the reverse scan control signal terminal VSS to the first node PU to reset the voltage of the first node PU, under the control of a reset signal Reset from the reset signal terminal RST.

The output circuit 130 may be coupled to the first node PU, a clock signal terminal CLK, and a signal output terminal OUT. The output circuit 130 can provide a clock signal CLK from the clock signal terminal CLK to the signal output terminal OUT as an output signal Output, under the control of the voltage of the first node PU.

The second reset circuit 140 may be coupled to a first voltage signal terminal VGL, the first node PU, a second node PD (also referred as a "pull-down node"), and the signal output terminal OUT. The second reset circuit 140 can provide a first voltage signal VGL from the first voltage signal terminal VGL to the first node PU and the signal output terminal OUT to reset the voltage of the first node PU and the output signal OUTPUT, under the control of the voltage of the second node PD.

The first pull-down control circuit 150 may be coupled with the first node PU, the second node PD, the first voltage signal terminal VGL, and a second voltage signal terminal GCH. The first pull-down control circuit 150 can control the voltage of the second node PD according to the voltage of the first node PU. Specifically, in response to the voltage of the first node being a valid voltage, the voltage of the second node is controlled to be an invalid voltage, and in response to the voltage of the first node being an invalid voltage, the voltage of the second node is controlled to be a valid voltage.

In an embodiment of the present disclosure, the invalid voltage refers to the voltage at which the output circuit 130 is turned off. In the case of an invalid voltage, the output circuit 130 does not operate and cannot provide the clock signal to the signal output terminal OUT. Correspondingly, the valid voltage refers to the voltage at which the output circuit 130 is turned on. In the case of a valid voltage, the output circuit 130 operates to provide the clock signal to the signal output terminal OUT. For example, the invalid voltage is a low level voltage and the valid voltage is a high level voltage.

In an embodiment of the present disclosure, during forward scanning, the forward scan control signal VDD is an AC (Alternating Current) voltage signal, and the reverse scan control signal VSS is a low level DC (Direct Current) voltage signal. During reverse scanning, the reverse scan control signal VSS is an AC voltage signal, and the forward scan control signal VDD is a low level DC voltage signal.

In an embodiment of the present disclosure, the first voltage signal VGL from the first voltage signal terminal VGL is a low level signal, and the second voltage signal GCH from the second voltage signal terminal GCH is a high level signal.

Figure 2:
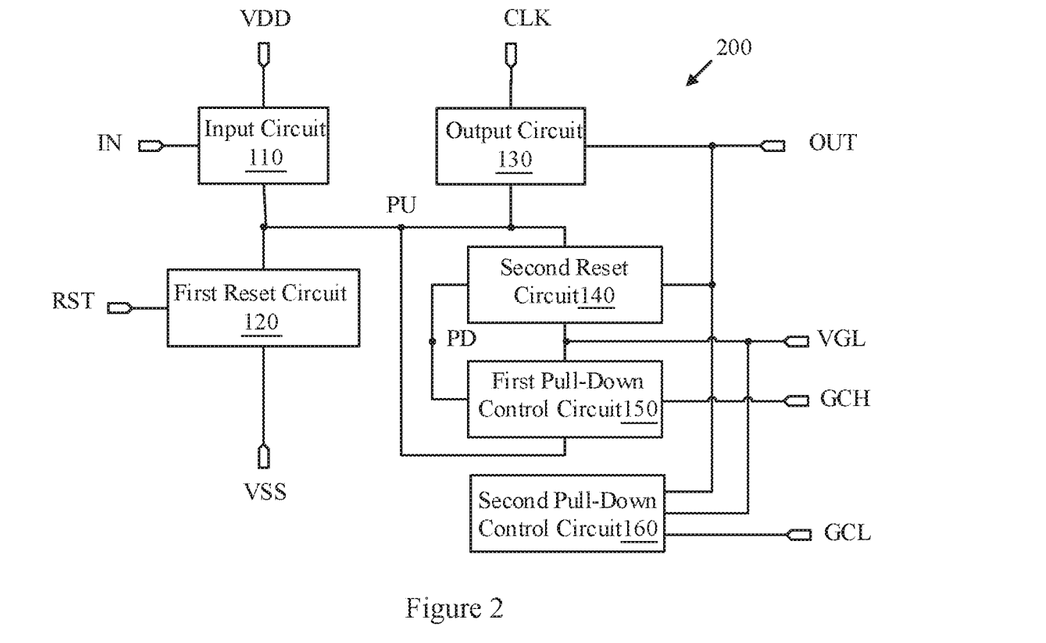
FIG. 2 is a schematic block diagram of a shift register unit according to another embodiment of the present disclosure.

FIG. 2 shows a schematic block diagram of a shift register unit 200 according to another embodiment of the present disclosure. As shown in FIG. 2, the shift register unit 200 may further include, in addition to the structure of the shift register unit 100, a second pull-down control circuit 160. The second pull-down control circuit 160 can be coupled to the first voltage signal terminal VGL, the signal output terminal OUT, and a third voltage signal terminal GCL. The second pull-down control circuit 160 can provide a first voltage signal VGL from the first voltage signal terminal VGL to the signal output terminal OUT to reset the output signal Output, under the control of a third voltage signal GCL from the third voltage signal terminal GCL.

Figure 3:
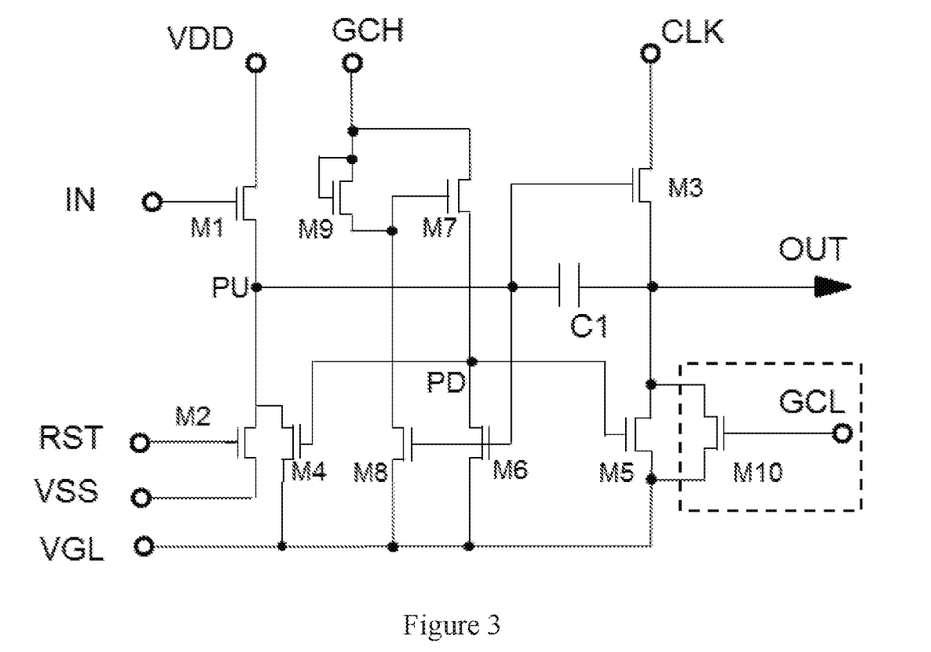
FIG. 3 is an exemplary circuit diagram of the shift register unit according to an embodiment of the present disclosure.

FIG. 3 shows an exemplary circuit diagram of a shift register unit according to an embodiment of the present disclosure. In the embodiment, N-type transistors or P-type transistors may be used for the transistors. Specifically, the transistors may be N-type or P-type field effect transistors (MOSFETs), or N-type or P-type bipolar transistors (BJTs). In the embodiment of the present disclosure, a gate of a transistor is referred to as a control electrode. Since a source and a drain of a transistor are symmetrical, the source and the drain are not distinguished herein. That is, the source of the transistor may be a first (or second) electrode and the drain may be a second (or first) electrode. Further, the function of the transistor may be implemented with any controlled switching device having a strobe signal input. The controlled intermediate terminal of a switching device for receiving a control signal (e.g. for turning the controlled switching device on and off) is referred to as the control electrode, and the other two terminals are referred to as the first electrode and the second electrode. As below, a detailed description will be made with an N-type field effect transistor (NMOS) as an example.

As shown in FIG. 3, the input circuit 110 may include a first transistor M1. A control electrode of the first transistor M1 is coupled to the signal input terminal IN, a first electrode of the first transistor M1 is coupled to the forward scan control signal terminal VDD, and a second electrode of the first transistor M1 is coupled to the first node PU.

The first reset circuit 120 may include a second transistor M2. A control electrode of the second transistor M2 is coupled to the reset signal terminal RST, a first electrode of the second transistor M2 is coupled to the reverse scan control signal terminal VSS, and a second electrode of the second transistor M2 is coupled to the first node PU.

The output circuit 130 may include a third transistor M3 and a first capacitor C1. A control electrode of the third transistor M3 is coupled to the first node PU, a first electrode of the third transistor M3 is coupled to the clock signal terminal CLK, and a second electrode of the third transistor M3 is coupled to the signal output terminal OUT. One end of the first capacitor C1 is coupled to the first node PU, and the other end is coupled to the signal output terminal OUT.

The second reset circuit 140 may include a fourth transistor M4 and a fifth transistor M5. A control electrode of the fourth transistor M4 is coupled to the second node PD, a first electrode of the fourth transistor M4 is coupled to the first voltage signal terminal VGL, and a second electrode of the fourth transistor M4 is coupled to the first node PU. A control electrode of the fifth transistor M5 is coupled to the second node PD, a first electrode of the fifth transistor M5 is coupled to the first voltage signal terminal VGL, and a second electrode of the fifth transistor M5 is coupled to the signal output terminal OUT.

The first pull-down control circuit 150 may include a sixth transistor M6, a seventh transistor M7, an eighth transistor M8, and a ninth transistor M9. A control electrode of the sixth transistor M6 is coupled to the first node PU, a first electrode of the sixth transistor M6 is coupled to the first voltage signal terminal VGL, and a second electrode of the sixth transistor M6 is coupled to the second node PD. A first electrode of the seventh transistor M7 is coupled to the second voltage signal terminal GCH, and a second electrode of the seventh transistor M7 is coupled to the second node PD. A control electrode of the eighth transistor M8 is coupled to the first node PU, a first electrode of the eighth transistor M8 is coupled to the first voltage signal terminal VGL, and a second electrode of the eighth transistor M8 is coupled to the control electrode of the seventh transistor M7. A control electrode and a first electrode of the ninth transistor M9 are coupled to the second voltage signal terminal GCH, and a second electrode of the ninth transistor M9 is coupled to the control electrode of the seventh transistor M7.

The second pull-down control circuit 160 may include a tenth transistor M10. A control electrode of the tenth transistor M10 is coupled to the third voltage signal terminal GCL, a first electrode of the tenth transistor M10 is coupled to the first voltage signal terminal VGL, and a second electrode of the tenth transistor M10 is coupled to the signal output terminal OUT.

Figure 4:
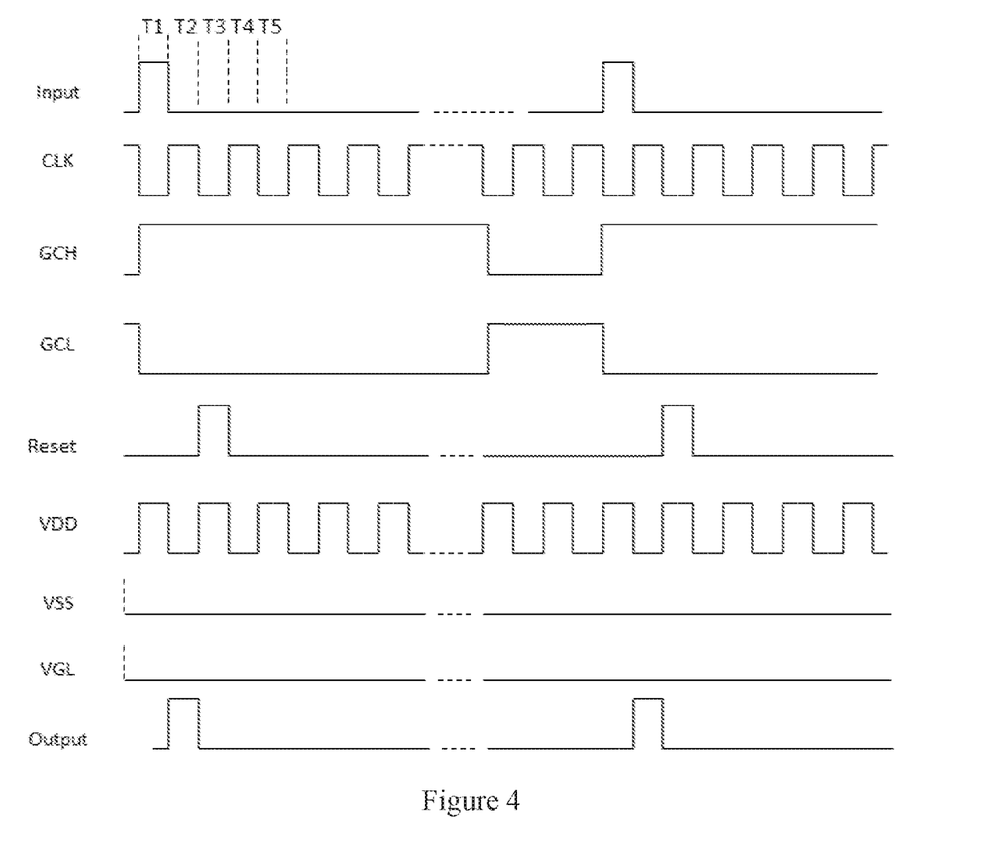
FIG. 4 is a timing diagram of signals for the shift register unit shown in FIG. 3.

As below, the working process of the shift register unit shown in FIG. 3 during forward scanning will be described in detail, in conjunction with the timing diagram shown in FIG. 4. In the following description, the transistors in the shift register unit are all N-type transistors as example. In this case, the forward scan control signal VDD is an AC voltage signal, the reverse scan control signal VSS is a low level DC voltage signal. The AC voltage signal and the clock signal have the same frequency and opposite phases. The first voltage signal VGL is a low level signal, and the second voltage signal GCH is a high level signal.

In a first time period (T1), the forward scan control signal VDD is at a high level, the clock signal CLK is at a low level, the input signal Input is at a high level, and the reset signal Reset is at a low level. During T1, the first transistor M1 is turned on, the input signal Input charges the first capacitor C1, and the voltage of the first node PU rises to a high level. In addition, the third transistor M3 is turned on so that a low level clock signal CLK is outputted from the signal output terminal OUT as the output signal Output. On the other hand, the sixth transistor M6, the eighth transistor M8, and the ninth transistor M9 are turned on. By controlling the ratio of the width-length-ratio (W/L) of the eighth transistor M8 to the width-length-ratio (W/L) of the ninth transistor M9, the voltage of the control electrode of the seventh transistor M7 can be controlled to be at a low level, so that the seventh transistor M7 is turned off. Since the sixth transistor M6 is turned on, the voltage of the second node PD is set to a low level. In this way, the control electrode of the fifth transistor M5 is set to a low level, so that the fifth transistor M5 is turned off. For example, the width-length ratio (W/L) of the ninth transistor M9 may be set to an integral multiple of the width-length ratio (W/L) of the eighth transistor M8. Since the fourth transistor M4 and the fifth transistor M5 are turned off, a stable signal output is ensured.

In a second time period (T2), the forward scan control signal VDD is at a low level, the clock signal CLK is at a high level, the input signal Input is at a low level, and the reset signal Reset is at a low level. During T2, the first transistor M1 is turned off, the first capacitor C1 is discharged, and the voltage of the first node PU is further pulled up due to bootstrapping. Since the voltage of the first node PU further rises on the basis of the first time period, the third transistor M3 maintains on. Therefore, a high level clock signal CLK is outputted from the signal output terminal OUT. That is, the signal output terminal outputs a high level output signal Output for driving the gate line. On the other hand, the sixth transistor M6, the eighth transistor M8, and the ninth transistor M9 maintain on, the fifth transistor M5 maintains off, and the voltage of the second node PD maintains at a low level. In addition, the fourth transistor M4 and the fifth transistor M5 maintain off, ensuring the output signal stable.

In a third time period (T3), the forward scan control signal VDD is at a high level, the clock signal CLK is at a low level, the input signal Input is at a low level, and the reset signal Reset is at a high level. During T3, the second transistor M2 is turned on, so that the voltage of the first node PU is reset to a low level, thereby turning the third transistor M3 off. On the other hand, the sixth transistor M6 and the eighth transistor M8 are turned off and no longer discharge the second node PD. The seventh transistor M7 and the ninth transistor M9 are turned on to set the second node PD to a high level. The fourth transistor M4 and the fifth transistor M5 are turned on, which further ensures that the first node PU and the signal output terminal OUT are at a low level.

In a fourth time period (T4), the forward scan control signal VDD is at a low level, the clock signal CLK is at a high level, the input signal Input is at a low level, and the reset signal Reset is at a low level. During T4, the voltage of the first node PU maintains a low level, and the sixth transistor M6 and the eighth transistor M8 maintain off. The seventh transistor M7 and the ninth transistor M9 maintain on, so as to maintain the second node PD at a high level. The fourth transistor M4 and the fifth transistor M5 maintain on, and further maintain the first node PU and the signal output terminal OUT at a low level.

In a fifth time period (T5), the forward scan control signal VDD is at a high level, the clock signal CLK is at a low level, the input signal Input is at a low level, and the reset signal Reset is at a low level. During T5, the voltage of the first node PU maintains at a low level, and the sixth transistor M6 and the eighth transistor M8 maintain off. The seventh transistor M7 and the ninth transistor M9 maintain on, so as to maintain the second node PD at a high level. The fourth transistor M4 and the fifth transistor M5 maintain on, and further maintain the first node PU and the signal output terminal OUT at a low level.

In a subsequent time period, the shift register unit sequentially repeats the operations of the aforementioned fourth time period (T4) and the fifth time period (T5), so that the voltage of the first node PU and the output signal of the signal output terminal maintain at a low level, until the shift register unit receives a high level input signal Input at the signal input terminal IN.

As above, based on the forward scan control signal VDD being an AC voltage signal and the reverse scan control signal VSS being a low level DC voltage signal, it can reduce the risk of wiring burnout and electrostatic discharge caused by the forward scan control signal VDD/the reverse scan control signal VSS. On the other hand, it can also reduce the accumulation of the leakage current in the start-up element (the first transistor M1), thereby preventing the abnormal turn-on of the shift register unit.

Alternatively, with respect to the operation of the shift register unit during forward scanning shown in FIG. 3, the first voltage signal may also be provided to the signal output terminal OUT by the second pull-down control circuit under the control of the third voltage signal GCL from the third voltage signal terminal GCL, so as to reset the output signal Output of the signal output terminal. The second voltage signal GCH provided from the second voltage signal terminal GCH and the third voltage signal GCL provided from the third voltage signal terminal GCL have opposite phases. Specifically, the third voltage signal GCL is set to a high level, and the second voltage signal GCH is set to a low level, before each frame starts. The tenth transistor M10 is turned on to provide the first voltage signal VGL to the signal output terminal OUT, so that the output signal Output maintains at a low level. Thereafter, the second voltage signal GCH returns to a high level, and the third voltage signal GCL returns to a low level.

Figure 5:
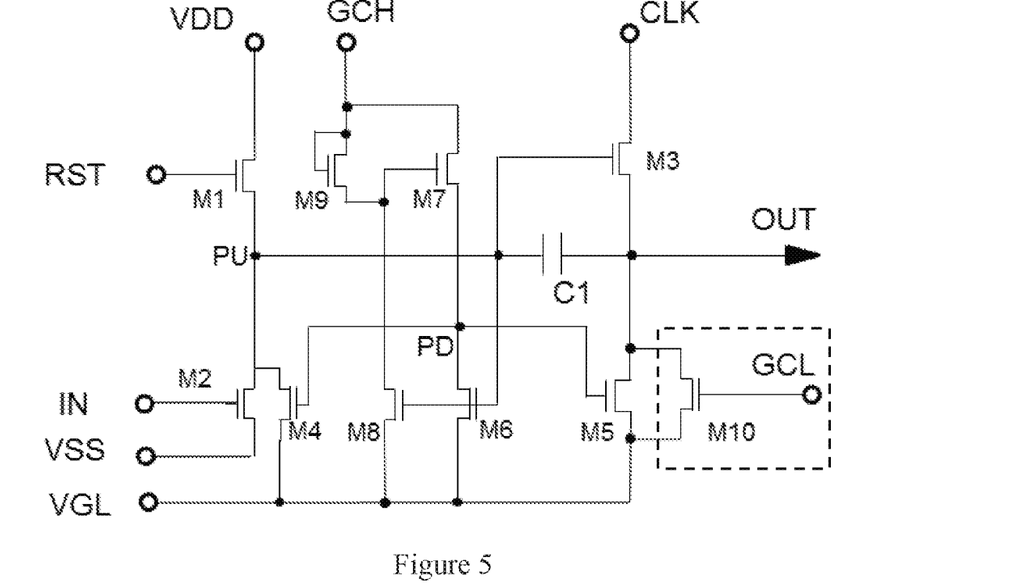
FIG. 5 is a schematic diagram of the shift register unit shown in FIG. 3 when it is used for reverse scanning.

FIG. 5 shows a schematic circuit diagram of the shift register unit shown in FIG. 3 when used for reverse scanning. The schematic circuit diagram is similar to the schematic circuit diagram of the shift register unit during forward scanning shown in FIG. 3, with the difference in that the signal input terminal IN of the shift register unit in FIG. 5 is equivalent to the reset signal terminal RST of the shift register unit in FIG. 3, and the reset signal terminal RST of the shift register unit in FIG. 5 is equivalent to the signal input terminal IN of the shift register unit in FIG. 3. The reverse scan control signal VSS is an AC voltage signal, and the forward scan control signal VDD is a low level DC voltage signal. The AC voltage signal and the clock signal have the same frequency and opposite phases.

Specifically, during reverse scanning, the second transistor M2 constitutes the input circuit 110. The control electrode of the second transistor M2 is coupled to the signal input terminal IN, the first electrode of the second transistor M2 is coupled to the reverse scan control signal terminal VSS, and the second electrode of the second transistor M2 is coupled to the first node PU.

The first transistor M1 constitutes the first reset circuit 120. The control electrode of the first transistor M1 is coupled to the reset signal terminal RST, the first electrode of the first transistor M1 is coupled to the forward scan control signal terminal VDD, and the second electrode of the first transistor M1 is coupled to the first node PU.

In addition, the output circuit 130, the second reset circuit 140, the respective configurations of the first pull-down control circuit 150 and the second pull-down control circuit 160 are the same during reverse scanning and during forward scanning, and the description thereof is omitted here.

Those skilled in the art can understand that the operation of the disclosed shift register unit during reverse scanning is similar to that during forward scanning.

Specifically, in the first time period (T1), the reverse scan control signal VSS is at a high level, the clock signal CLK is at a low level, the input signal Input is at a high level, and the reset signal Reset is at a low level. During T1, the second transistor M2 is turned on, the input signal Input charges the first capacitor C1, and the voltage of the first node PU rises to a high level. In addition, the third transistor is turned on so that a low level clock signal CLK is outputted from the signal output terminal OUT, as the output signal Output. On the other hand, the sixth transistor M6, the eighth transistor M8, and the ninth transistor M9 are turned on. By controlling the ratio of the width-length-ratio (W/L) of the eighth transistor M8 to the width-length-ratio (W/L) of the ninth transistor M9, the voltage of the control electrode of the seventh transistor M7 can be controlled to be at a low level, so that the seventh transistor M7 is turned off. Since the sixth transistor M6 is turned on, the voltage of the second node PD is set to a low level. In this way, the control electrode of the fifth transistor M5 is set to a low level, so that the fifth transistor M5 is turned off. For example, the width-length ratio (W/L) of the ninth transistor M9 may be set to an integral multiple of the width-length ratio (W/L) of the eighth transistor M8. Since the fourth transistor M4 and the fifth transistor M5 are turned off, a stable signal output is ensured.

In the second time period (T2), the reverse scan control signal VSS is at a low level, the clock signal CLK is at a high level, the input signal Input is at a low level, and the reset signal Reset is at a low level. During T2, the second transistor M2 is turned off, the first capacitor C1 is discharged, and the voltage of the first node PU is further pulled up due to bootstrapping. Since the voltage of the first node PU further rises on the basis of the first time period, the third transistor M3 maintains on. Therefore, a high level clock signal CLK is outputted from the signal output terminal OUT. That is, the signal output terminal outputs an output signal Output for driving the gate line. On the other hand, the sixth transistor M6, the eighth transistor M8 and the ninth transistor M9 maintain on, the fifth transistor M5 maintains off, and the voltage of the second node PD maintains at a low level. In addition, the fourth transistor M4 and the fifth transistor M5 maintain off, ensuring the output signal stable.

In the third time period (T3), the reverse scan control signal VSS is at a high level, the clock signal CLK is at a low level, the input signal Input is at a low level, and the reset signal Reset is at a high level. During T3, the first transistor M1 is turned on, so that the voltage of the first node PU is reset to a low level, thereby turning the third transistor M3 off. On the other hand, the sixth transistor M6 and the eighth transistor M8 are turned off and no longer discharge the second node PD. The seventh transistor M7 and the ninth transistor M9 are turned on to set the second node PD to a high level. The fourth transistor M4 and the fifth transistor M5 are turned on, which further ensures that the first node PU and the signal output terminal OUT are at a low level.

In addition, the fourth time period (T4) and the fifth time period (T5) during reverse scanning are similar to those during forward scanning in FIG. 3, and the description thereof is omitted here.

In summary, on the basis that the reverse scan control signal VSS is an AC signal and the forward scan control signal VDD is a low level DC signal, it can reduce the risk of wiring burnout and electrostatic discharge caused by the forward scan control signal VDD/the reverse scan control signal VSS. On the other hand, it can also reduce the accumulation of the leakage current in the start-up element (the second transistor M2), thereby preventing the abnormal turn-on of the shift register unit.

Alternatively, during reverse scanning, before each frame starts, the third voltage signal GCL may also be set to a high level and the second voltage signal GCH may also be set to a low level. The tenth transistor M10 is turned on to supply the first voltage signal VGL to the signal output terminal OUT so that the output signal Output maintains at a low level. Thereafter, the second voltage signal GCH returns to a high level, and the third voltage signal GCL returns to a low level.

Figure 6:
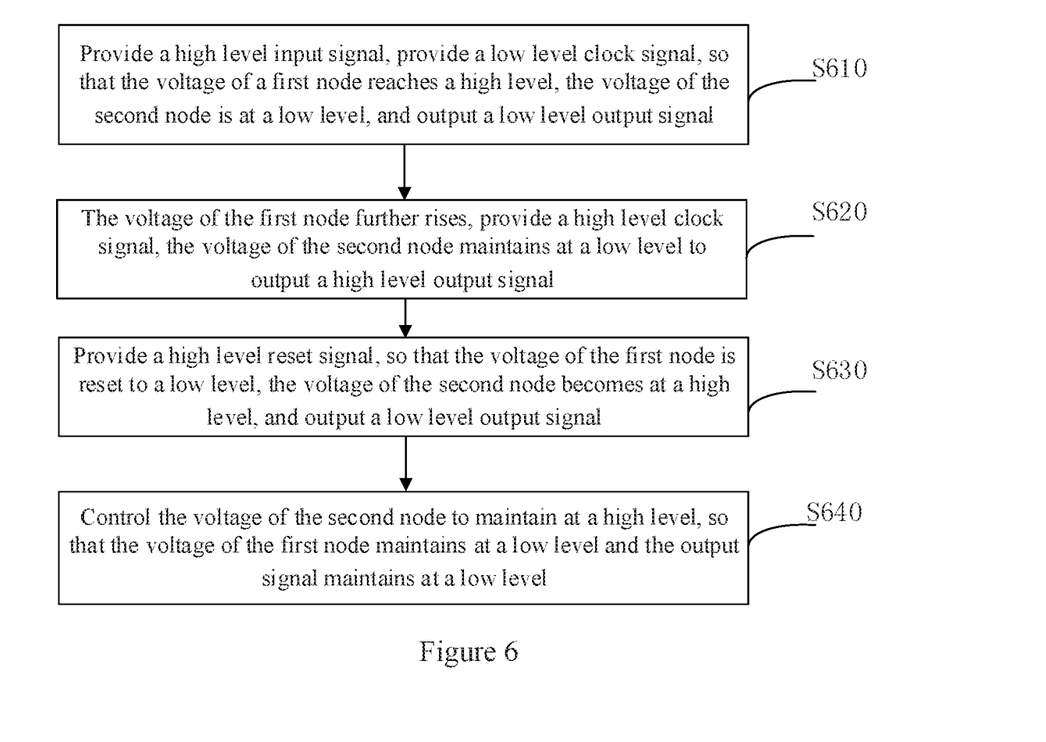
FIG. 6 is a schematic flowchart of a method for driving the shift register unit shown in FIG. 1 according to an embodiment of the present disclosure.

FIG. 6 is a schematic flowchart of a method for driving the shift register unit 100 shown in FIG. 1 according to an embodiment of the present disclosure. In the embodiment of the present disclosure, the forward scan control signal VDD is an AC voltage signal, the reverse scan control signal VSS is a low level DC voltage signal, and the AC voltage signal and the clock signal have the same frequency and opposite phases. The first voltage signal VGL is a low level signal, and the second voltage signal GCH is a high level signal.

In step S610, a high level input signal is provided to the signal input terminal, and a low level clock signal is provided to the clock signal terminal, so that the voltage of the first node reaches a high level, the voltage of the second node is at a low level, and a low level output signal is outputted from the signal output terminal.

In step S620, the voltage of the first node further rises to provide a high level clock signal to the clock signal terminal, and the voltage of the second node maintains at a low level, so that a high level output signal is outputted from the signal output terminal.

In step S630, a high level reset signal is provided to the reset signal terminal, so that the voltage of the first node is reset to a low level, the voltage of the second node becomes at a high level, and a low level output signal is outputted from the signal output terminal.

In step S640, the voltage of the second node is controlled to maintain at a high level so that the voltage of the first node maintains at a low level and the output signal maintains at a low level.

Described above is the process of driving the shift register unit 100 during forward scanning. Those skilled in the art can understand that the process of driving the shift register unit 100 during reverse scanning is similar as that during forward scanning, with the difference in that a low level DC voltage signal is supplied to the forward scan control signal terminal VDD, an AC voltage signal is provided to the reverse scan control signal terminal VSS, and a reset signal equivalent to that during forward scanning is provided to the signal input terminal IN, an input signal equivalent to that during forward scanning is provided to the reset signal terminal RST. Therefore, the same parts as those in the above-described driving during forward scanning will not be specifically described here.

Figure 7:
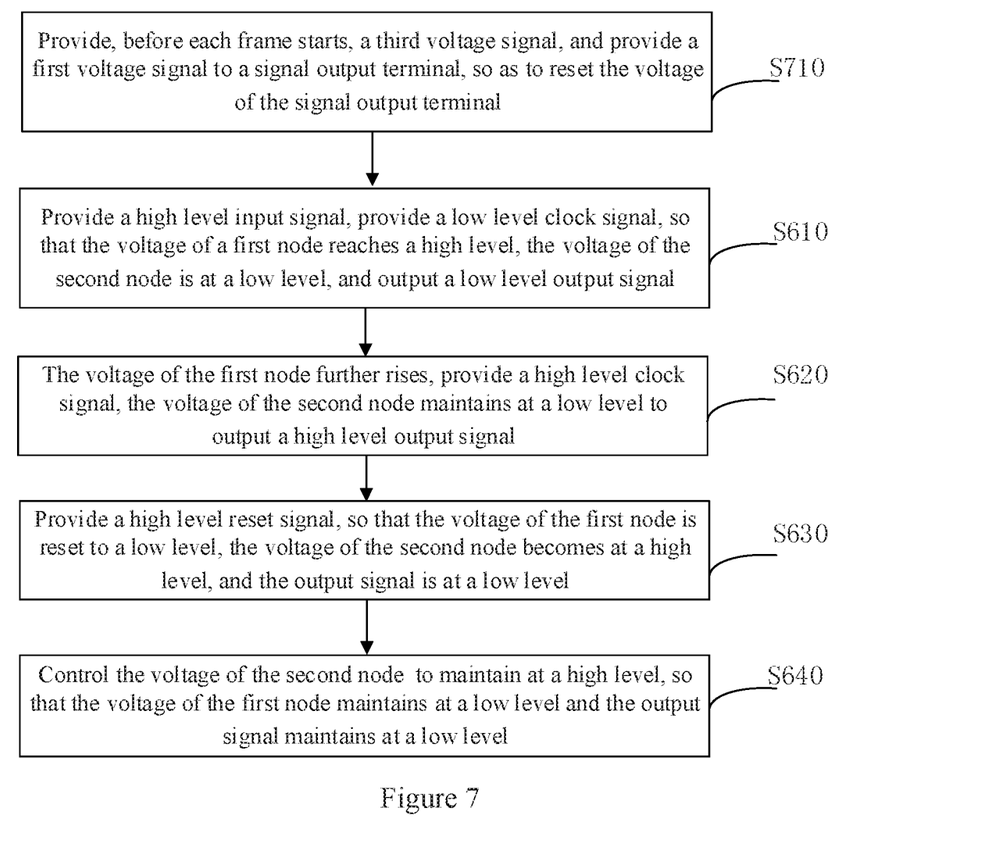
FIG. 7 is a schematic flowchart of a method for driving the shift register unit shown in FIG. 2 according to another embodiment of the present disclosure.

FIG. 7 shows a schematic flowchart of a method for driving the shift register unit 200 shown in FIG. 2 according to an embodiment of the present disclosure. As shown in FIG. 7, before step S610 shown in FIG. 6, step S710 is performed. In step S710, before each frame starts, a third voltage signal is provided to the second pull-down control circuit through the third voltage signal terminal, so that the second pull-down control circuit is turned on to provide the first voltage signal from the first voltage terminal to the signal output terminal so as to reset the voltage of the signal output terminal.

Figure 8:
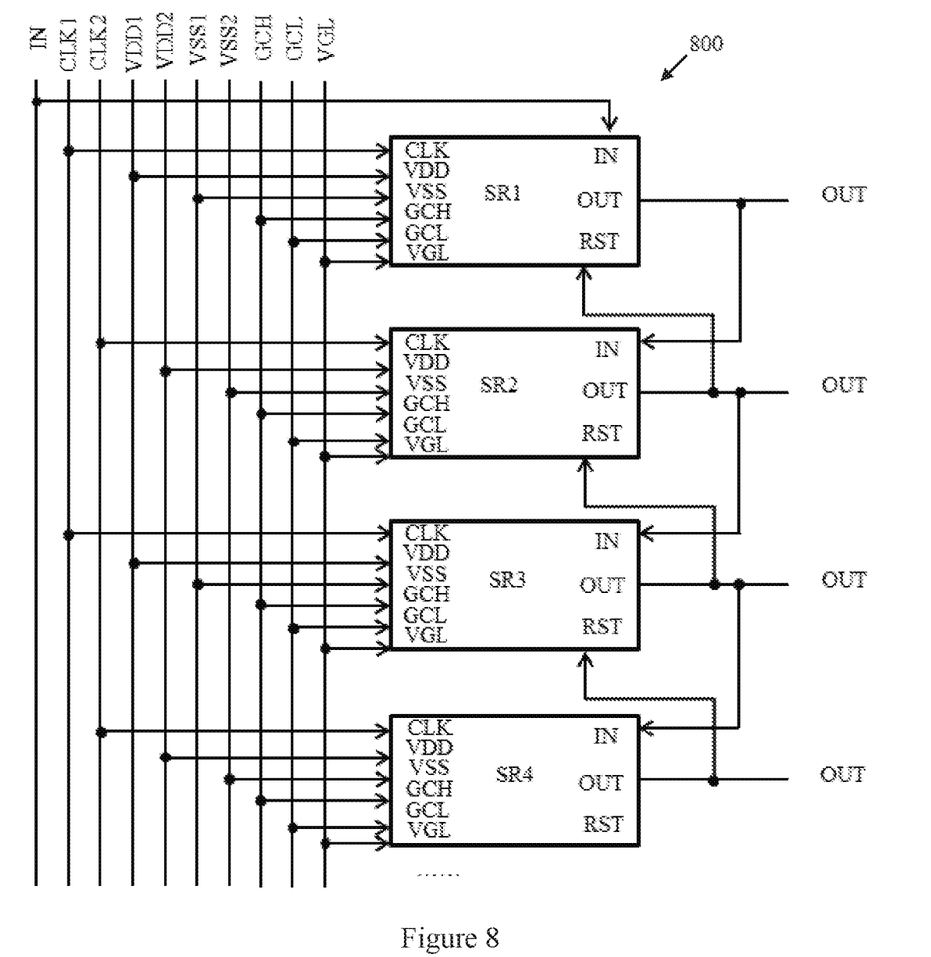
FIG. 8 is an exemplary structural diagram of a gate driving circuit according to an embodiment of the present disclosure.

FIG. 8 shows a schematic structural diagram of a gate driving circuit 800 according to an embodiment of the present disclosure. As shown in FIG. 8, the gate driving circuit 800 may include N+1 cascaded shift register units SR1, SR2, . . . , SRn, SR(N+1). The shift register unit of each stage may employ the structure of the shift register unit 100 shown in FIG. 1 or the shift register unit 200 shown in FIG. 2.

In the gate driving circuit 800, ports of the shift register unit of each stage may include a forward scan control signal terminal VDD, a reverse scan control signal terminal VSS, a first voltage signal terminal VGL, a second voltage signal terminal GCH, a third voltage signal terminal GCL, a clock signal input terminal CLK, a signal input terminal IN, a reset signal terminal RST, and a signal output terminal OUT.

The signal output terminal OUT of a shift register unit SR(N) of a stage is coupled to the signal input terminal IN of the shift register unit SR(N+1) of respective next stage, the reset signal terminal RST of a shift register unit SR(N) in a stage is coupled to the signal output terminal OUT of the shift register unit SR(N+1) of the next stage. For example, as shown in FIG. 8, the reset signal terminal RST of the first-stage shift register unit SR1 receives an output signal from the signal output terminal OUT of the second-stage shift register unit SR2 as the reset signal of the first-stage shift register unit SR1. The signal input terminal IN of the second-stage shift register unit SR2 receives an output signal from the signal output terminal OUT of the first-stage shift register unit SR1 as the input signal of the second-stage shift register unit SR1.

A first forward scan control signal VDD1 is inputted to the forward scan control signal VDD of the (2N−1)st-stage shift register unit, a first reverse scan control signal VSS1 is inputted to the reverse scan control signal terminal thereof, and a first clock signal CLK1 is inputted to the clock signal terminal thereof. A second forward scan control signal VDD2 is inputted to the forward scan control signal terminal of the 2Nth-stage shift register unit, a second reverse scan control signal VSS2 is inputted to the reverse scan control signal terminal thereof, and a second clock signal CLK2 is inputted to the clock signal terminal thereof. As shown in FIG. 8, for the first-stage and third-stage shift registers, the first forward scan control signal VDD1 is inputted to the forward scan control signal terminal VDD, a first reverse scan control signal VSS1 is inputted to the reverse scan control signal terminal, and a first clock signal CLK1 is inputted to the clock signal terminal, wherein the first forward scan control signal and the first clock signal have the same frequency and opposite phases. For the second-stage and fourth-stage shift register units, a second forward scan control signal VDD2 is inputted to the forward scan control signal terminal, a second reverse scan control signal VSS2 is inputted to the reverse scan control signal terminal, and a second clock signal CLK2 is inputted to the clock signal terminal, wherein the second forward scan control signal and the second clock signal have the same frequency and opposite phases.

Furthermore, the first forward scan control signal VDD1 and the second forward scan control signal VDD2 have opposite phases, and the first clock signal CLK1 and the second clock signal CLK2 have opposite phases.

Figure 9:
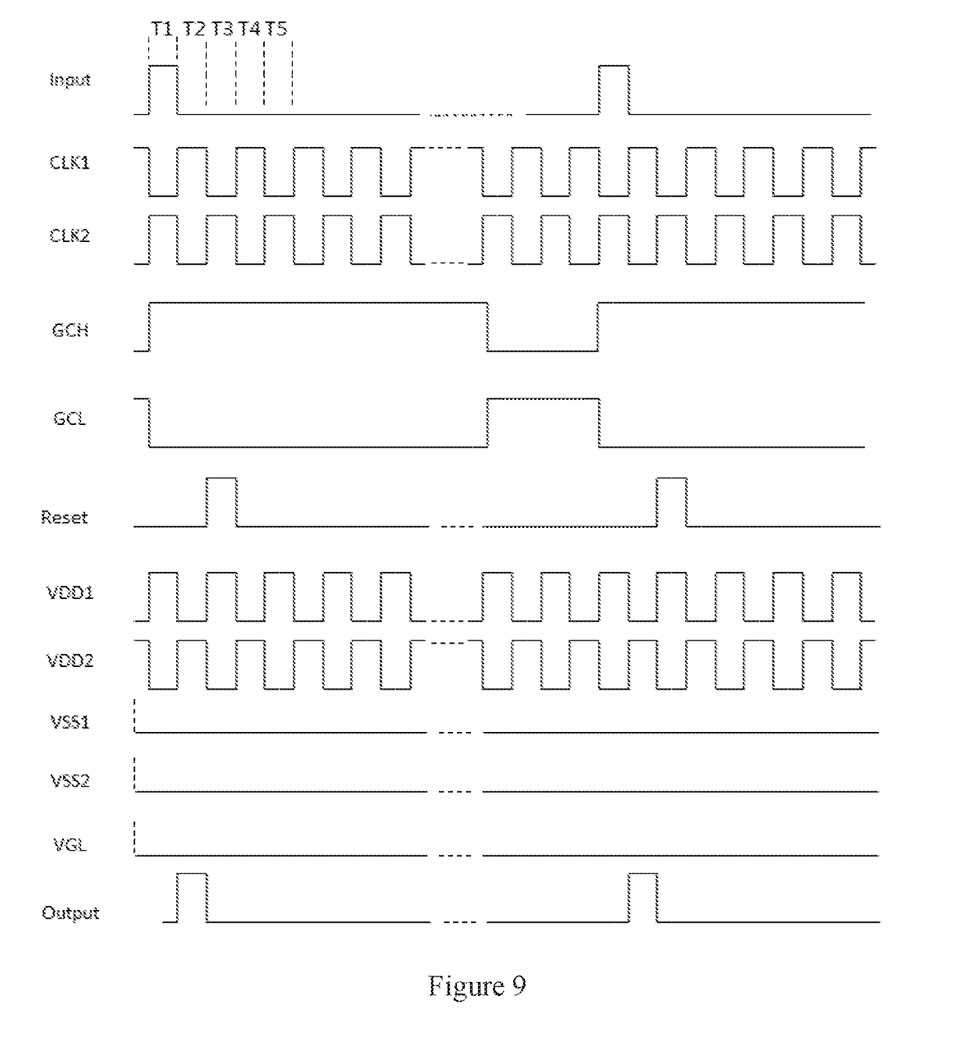
FIG. 9 is a timing diagram of signals for the gate driving circuit shown in FIG. 8 according to an embodiment of the present disclosure.

The operation of the gate driving circuit 800 shown in FIG. 8 will be described in detail with reference to the timing chart shown in FIG. 9. In the following description, the transistors in the shift register units are all N-type transistors. In this case, the first reverse scan control signal terminal VSS1, the second reverse scan control signal terminal VSS2, and the first voltage signal VGL are all at a low level. The second voltage signal GCH and the third voltage signal GCL have opposite phases, and the second voltage signal GCH is at a high level during operation.

In the first time period (T1), the first forward scan control signal VDD1 is at a high level, the second forward scan control signal VDD1 is at a low level, the first clock signal CLK1 is at a low level, and the second clock signal CLK2 is at a high level. A high level input signal INPUT is inputted to the signal input terminal IN of the first-stage shift register unit SR1, so that the signal output terminals OUT of the shift register units of the respective stages output low level output signals.

In the second time period (T2), the first forward scan control signal VDD1 is at a low level, the second forward scan control signal VDD1 is at a high level, the first clock signal CLK1 is at a high level, and the second clock signal CLK2 is at a low level. The signal output terminal OUT of the first-stage shift register unit SR1 outputs a high level output signal OUTPUT1 to the signal input terminal IN of the second-stage shift register unit SR2 as an input signal of the second-stage shift register unit SR2. The signal output terminals OUT of the shift register units of other stages output low level output signals.

In the third time period (T3), the first forward scan control signal VDD1 is at a high level, the second forward scan control signal VDD1 is at a low level, the first clock signal CLK1 is at a low level, and the second clock signal CLK2 is at a high level. The signal output terminal OUT of the second-stage shift register unit SR2 outputs a high level output signal OUTPUT2 to the reset signal terminal RST of the first-stage shift register unit SR1, as a reset signal of the first-stage shift register unit SR1, so as to reset the output signal OUTPUT1 of the first-stage shift register unit SR1 to a low level. Moreover, the output signal OUTPUT2 of the second-stage shift register unit SR2 is further outputted to the signal input terminal IN of the third-stage shift register unit SR3, as an input signal of the third-stage shift register unit SR3.

In the following time period, high level output signals are output from the shift register units of respective stages sequentially.

Above all, since the forward scan control signal VDD is an AC voltage signal and the reverse scan control signal VSS is a low level DC voltage signal, it can reduce the risk of wiring burnout and electrostatic discharge caused by the forward scan control signal VDD/the reverse scan control signal VSS. On the other hand, it can also reduce the accumulation of the leakage current in the input transistor, thereby preventing the abnormal turn-on of the shift register unit.

Furthermore, before each frame starts, the third voltage signal GCL of the shift register unit of each stage in the gate driving circuit 800 is set to a high level and the second voltage signal GCH is set to a low level so as to maintain the output signal Output at a low level. Thereafter, the second voltage signal GCH returns to a high level, and the third voltage signal terminal GCL returns to a low level.

Figure 10:
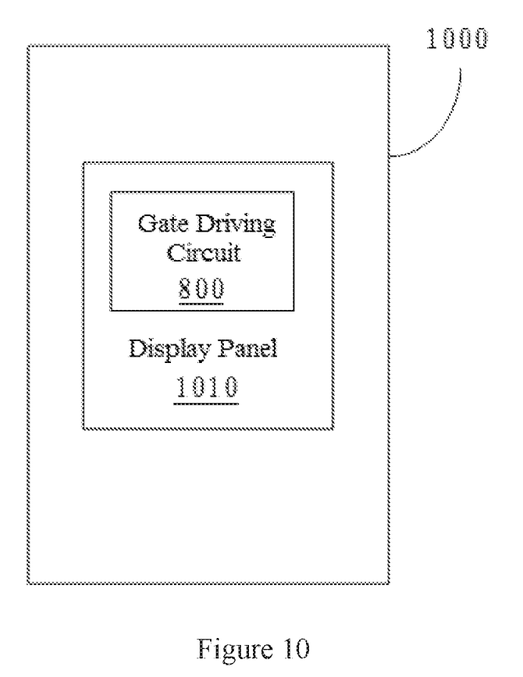
FIG. 10 is a schematic block diagram of a display device according to an embodiment of the present disclosure.

FIG. 10 shows a schematic block diagram of a display device 1000 according to an embodiment of the present disclosure. As shown in FIG. 10, the display device 1000 may include a display panel 1010. The display panel 1010 may include a gate driving circuit 800 as shown in FIG. 8.

In embodiments of the present disclosure, the display device 1000 may be, for example, a display screen, a cellphone, a tablet computer, a wearable device, and the like.

A number of embodiments of the present disclosure are described in detail in the above, but the scope of protection of the present disclosure is not limited thereto. It will be apparent to those of ordinary skill in the art that various modifications, substitutions or variations can be made to the embodiments of the present disclosure without departing from the spirit and scope of the present disclosure. The scope of protection of the present disclosure is defined by the appended claims.

What is claimed is:

1. A shift register unit, comprising:
   an input circuit configured to provide a forward scan control signal from a forward scan control signal terminal to a first node according to an input signal from a signal input terminal;
   a first reset circuit configured to provide, according to a reset signal from a reset signal terminal, a reverse scan control signal from a reverse scan control signal terminal to the first node to reset the voltage of the first node;
   an output circuit configured to provide a clock signal from a clock signal terminal to a signal output terminal as an output signal according to the voltage of the first node;
   a second reset circuit configured to provide, according to the voltage of a second node, a first voltage signal from a first voltage signal terminal to the first node and the signal output terminal to reset the voltage of the first node and the output signal; and
   a first pull-down control circuit configured to control the voltage of the second node according to the voltage of the first node;
   wherein during forward scanning, the forward scan control signal is an AC voltage signal, and the reverse scan control signal is a DC voltage signal;
   wherein during reverse scanning, the reverse scan control signal is an AC voltage signal, and the forward scan control signal is a DC voltage signal; and
   wherein the AC voltage signal and the clock signal have the same frequency and opposite phases.

2. The shift register unit according to claim 1, wherein the input circuit comprises a first transistor having a control electrode coupled to the signal input terminal, a first electrode coupled to the forward scan control signal terminal, and a second electrode coupled to the first node.

3. The shift register unit according to claim 1, wherein the first reset circuit comprises a second transistor having a control electrode coupled to the reset signal terminal, a first electrode coupled to the reverse scan control signal terminal, and a second electrode coupled to the first node.

4. The shift register unit according to claim 1, wherein the output circuit comprises a third transistor having a control electrode coupled to the first node, a first electrode coupled to the clock signal terminal, and a second electrode coupled to the signal output terminal; and a first capacitor coupled between the first node and the signal output terminal.

5. The shift register unit according to claim 1, wherein the second reset circuit comprises:
a fourth transistor having a control electrode coupled to the second node, a first electrode coupled to the first voltage signal terminal, and a second electrode coupled to the first node; and
a fifth transistor having a control electrode coupled to the second node, a first electrode coupled to the first voltage signal terminal, and a second electrode coupled to the signal output terminal.

6. The shift register unit according to claim 1, wherein the first pull-down control circuit comprises:
a sixth transistor having a control electrode coupled to the first node, a first electrode coupled to the first voltage signal terminal, and a second electrode coupled to the second node;
a seventh transistor having a first electrode coupled to a second voltage signal terminal, and a second electrode coupled to the second node;
an eighth transistor having a control electrode coupled to the first node, a first electrode coupled to the first voltage signal terminal, and a second electrode coupled to the control electrode of the seventh transistor; and
a ninth transistor having a control electrode and a first electrode coupled to the second voltage signal terminal, and a second electrode coupled to the control electrode of the seventh transistor.

7. The shift register unit according to claim 1, further comprising a second pull-down control circuit configured to provide a first voltage signal from the first voltage signal terminal to the signal output terminal according to a third voltage signal from a third voltage signal terminal.

8. The shift register unit according to claim 7, wherein the second pull-down control circuit comprises a tenth transistor having a control electrode coupled to the third voltage signal terminal, a first electrode coupled to the first voltage signal terminal, and a second electrode coupled to the signal output terminal.

9. A shift register unit, comprising:
a first transistor having a control electrode coupled to a signal input terminal, a first electrode coupled to a forward scan control signal terminal, and a second electrode coupled to a first node;
a second transistor having a control electrode coupled to a reset signal terminal, a first electrode coupled to a reverse scan control signal terminal, and a second electrode coupled to the first node;
a third transistor having a control electrode coupled to the first node, a first electrode coupled to a clock signal terminal, and a second electrode coupled to a signal output terminal;
a first capacitor coupled between the first node and the signal output terminal;
a fourth transistor having a control electrode coupled to a second node, a first electrode coupled to a first voltage signal terminal, and a second electrode coupled to the first node;

a fifth transistor having a control electrode coupled to the second node, a first electrode coupled to the first voltage signal terminal, and a second electrode coupled to the signal output terminal;
a sixth transistor having a control electrode coupled to the first node, a first electrode coupled to the first voltage signal terminal, and a second electrode coupled to the second node;
a seventh transistor having a first electrode coupled to a second voltage signal terminal, and a second electrode coupled to the second node;
an eighth transistor having a control electrode coupled to the first node, a first electrode coupled to the first voltage signal terminal, and a second electrode coupled to the control electrode of the seventh transistor; and
a ninth transistor having a control electrode and a first electrode coupled to the second voltage signal terminal, and a second electrode coupled to the control electrode of the seventh transistor,
wherein during forward scanning, the forward scan control signal is an AC voltage signal, and the reverse scan control signal is a DC voltage signal;
wherein during reverse scanning, the reverse scan control signal is an AC voltage signal, and the forward scan control signal is a DC voltage signal; and
wherein the AC voltage signal and the clock signal have the same frequency and opposite phases.

10. The shift register nit according to claim 9, further comprising:
a tenth transistor having a control electrode coupled to a third voltage signal terminal, a first electrode coupled to the first voltage signal terminal, and a second electrode coupled to the signal output terminal.

11. A method for driving the shift register unit according to claim 1, comprising:
in a first time period, providing the input signal to the input circuit through the signal input terminal so that the input circuit is turned on, outputting the forward scan control signal from the forward scan control signal terminal to the first node through the input circuit so that the output circuit is turned on, outputting the clock signal from the clock signal terminal to the signal output terminal through the output circuit, and controlling voltage of the second node by the first pull-down control circuit according to voltage of the first node;
in a second time period, maintaining the output circuit turned on, so that the clock signal is outputted to the signal output terminal, and controlling the voltage of the second node by the first pull-down control circuit according to the voltage of the first node;
in a third time period, providing the reset signal to the first reset circuit through the reset signal terminal so that a first reset circuit is turned on, outputting the reverse scan control signal from the reverse scan control signal terminal to the first node through the first reset circuit to reset the voltage of the first node so that the output circuit is turned off, providing a second voltage signal from g second voltage signal terminal to the second node so that the second reset circuit is turned on, and outputting the first voltage signal from the first voltage signal terminal to the first node and the signal output terminal through the second reset circuit to reset the voltage of the first node and the signal output terminal;
wherein the forward scan control signal terminal outputs an AC voltage signal, the reverse scan control signal terminal outputs a DC voltage signal, and the AC voltage signal and the clock signal have the same frequency and opposite phases.

12. The method according to claim 11,
wherein the forward scan control signal terminal outputs a DC voltage signal, and the reverse scan control signal terminal outputs an AC voltage signal; and
wherein a reset signal is provided to the signal input terminal and an input signal is provided to the reset signal terminal.

13. The method according to claim 11, wherein the shift register unit further comprises a second pull-down control circuit, configured to provide the first voltage signal from the first voltage signal terminal to the signal output terminal according to a third voltage signal from a third voltage signal terminal;
wherein the method further comprises before each frame starts, providing the third voltage signal to the second pull-down control circuit through the third voltage signal terminal, so that the second pull-down control circuit is turned on, so as to provide the first voltage signal from the first voltage terminal to the signal output terminal and reset the voltage of the signal output terminal.

14. A gate driving circuit comprising a plurality of cascaded shift register units,
wherein the shift register unit of each stage is the shift register unit according to claim 1,
wherein a signal output terminal of a shift register unit of the stage is coupled to a signal input terminal of the shift register unit of respective next stage, and a reset signal terminal of a shift register unit of the stage is coupled to the signal output terminal of the shift register unit of respective next stage;
wherein for a (2N−1)st-stage shift register unit, a first forward scan control signal is inputted to a forward scan control signal terminal, a first reverse scan control signal is inputted to a reverse scan control signal terminal, and a first clock signal is inputted to a clock signal terminal, the first forward scan control signal and the first clock signal having the same frequency and opposite phases;
wherein for a 2Nth-stage shift register unit, a second forward scan control signal is inputted to the forward scan control signal terminal, a second reverse scan control signal is inputted to the reverse scan control signal terminal, and a second clock signal is inputted to the clock signal terminal, the second forward scan control signal and the second clock signal having the same frequency and opposite phases;
wherein the first forward scan control signal and the second forward scan control signal have opposite phases, and the first clock signal and the second clock signal have opposite phases.

15. A display pane comprising a gate driving circuit according to claim 12.

16. A display device comprising a display panel according to claim 13.

* * * * *

UNITED STATES PATENT AND TRADEMARK OFFICE
CERTIFICATE OF CORRECTION

PATENT NO. : 10,593,415 B2  
APPLICATION NO. : 15/780157  
DATED : March 17, 2020  
INVENTOR(S) : Haifei Su et al.

Page 1 of 1

It is certified that error appears in the above-identified patent and that said Letters Patent is hereby corrected as shown below:

In the Claims

In Claim 10, Column 16, Line 29, delete "register nit" and insert therefor -- register unit --.
In Claim 11, Column 16, Line 59, delete "from g second" and insert therefor -- from a second --.
In Claim 15, Column 18, Line 25, delete "display pane" and insert therefor -- display panel --.

Signed and Sealed this
Twenty-first Day of July, 2020

Andrei Iancu
*Director of the United States Patent and Trademark Office*